(12) United States Patent
Liaghati (10) Patent No.: US 9,425,819 B1
(45) Date of Patent: Aug. 23, 2016

(54) ADAPTIVE COMPRESSION OF DATA

(71) Applicant: The Boeing Company, Chicago, IL (US)

(72) Inventor: Amir L. Liaghati, Huntsville, AL (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/609,007

(22) Filed: Jan. 29, 2015

(51) Int. Cl.
*H03M 7/00* (2006.01)
*H03M 7/30* (2006.01)
*H04Q 9/00* (2006.01)

(52) U.S. Cl.
CPC ............... *H03M 7/3055* (2013.01); *H04Q 9/00* (2013.01)

(58) Field of Classification Search
CPC ...... H03M 7/30; H03M 7/3088; H04L 29/06; H04L 63/04; H04L 63/0428; H04L 63/1441; H04N 19/169; H04N 19/12; H04N 19/156; H04N 19/132; G06F 17/30144; G06F 17/30153; G06F 17/30233
USPC ........ 341/50–91; 709/247; 370/465; 707/692
See application file for complete search history.

(56) References Cited

U.S. PATENT DOCUMENTS

| | | | | |
|---|---|---|---|---|
| 2,112,384 A * | 3/1938 | Sloan | ...................... | A42C 1/04 2/175.9 |
| 5,701,302 A * | 12/1997 | Geiger | ..................... | H03M 7/30 341/106 |
| 8,805,149 B2 * | 8/2014 | Takemura | ............... | G02F 1/035 385/129 |
| 2002/0103938 A1 * | 8/2002 | Brooks | ................... | H03M 7/30 709/247 |
| 2004/0255215 A1 * | 12/2004 | Hildebrant | ..... | G01R 31/318335 714/742 |
| 2005/0024236 A1 * | 2/2005 | Gosdin | ................ | G08G 5/0013 340/905 |
| 2007/0096954 A1 * | 5/2007 | Boldt | ...................... | H03M 7/30 341/50 |
| 2010/0228703 A1 * | 9/2010 | Schneider | ............... | H03M 7/30 707/693 |
| 2013/0231947 A1 * | 9/2013 | Shusterman | ........ | G06F 19/3443 705/2 |
| 2014/0188819 A1 * | 7/2014 | Bagal | ................ | G06F 17/30144 707/692 |
| 2015/0110131 A1 * | 4/2015 | Roskind | ............. | H04L 63/0428 370/465 |

OTHER PUBLICATIONS

Mansour et al., "Simulation of DPCM and ADM Systems," Computer Modelling and Simulation (UKSim), 2012 UKSim 14th International Conference on; pp. 416,421, Mar. 28-30, 2012; (6 pgs).

Simkus et al., "Ultra-low delay lossy audio coding using DPCM and block companded quantization," Communications Theory Workshop (AusCTVV); 2013 Australian, pp. 43,46, Jan. 29-Feb. 1, 2013; (4 pgs).

\* cited by examiner

*Primary Examiner* — Lam T Mai
(74) *Attorney, Agent, or Firm* — Toler Law Group, PC (57) ABSTRACT

A method of encoding data includes determining a magnitude of change between a first value associated with first data and a second value associated with second data based on a comparison of the first value and the second value. The first value is encoded into a first set of bits having a first number of bits. The method includes determining, based on the comparison of the first value and the second value, a second number of bits (that is less than the first number of bits) to be used to encode the magnitude of change. The method includes encoding the magnitude of change into a second set of bits having the second number of bits. The method further includes sending the second set of bits and a first indicator, with the first indicator indicating that the magnitude of change is encoded into the second number of bits.

20 Claims, 6 Drawing Sheets

ADAPTIVE COMPRESSION OF DATA

FIELD

The present disclosure generally relates to adaptive compression of data.

BACKGROUND

Differential Pulse Code Modulation (DPCM) is an example of an approach to data compression. In a DPCM approach, rather than quantizing each data sample into a "full" number of bits, a difference between consecutive data samples may be quantized into a reduced number of bits (for transmission or storage).

SUMMARY

In an embodiment, a method of encoding data is disclosed. The method includes determining a magnitude of change between a first value associated with first data (that is encoded into a first set of bits having a first number of bits) and a second value associated with second data based on a comparison of the first value and the second value. Based on the comparison, a second number of bits (that is less than the first number of bits) may be used to encode the magnitude of change. The method includes encoding the magnitude of change into a second set of bits having the second number of bits. The second set of bits and an indicator may be sent, with the indicator indicating that the magnitude of change is encoded into the second number of bits.

In another embodiment, a method of decoding data is disclosed. The method includes receiving a first set of bits having a first number of bits and decoding the first set of bits to determine that the first set of bits corresponds to a first indicator. The first indicator indicates that a second number of bits are to be decoded, where the second number of bits is different from the first number of bits. The method further includes receiving a second set of bits having the second number of bits and decoding the second set of bits to determine a magnitude of change between a first value associated with first data and a second value associated with second data.

In another embodiment, a system includes a processor and a memory that is communicatively coupled to the processor. The memory stores instructions that are executable by the processor to perform various operations. The operations may include determining a magnitude of change between a first value associated with first data and a second value associated with second data based on a comparison of the first value and the second value. The first value is encoded into a first set of bits having a first number of bits. Based on the comparison, a second number of bits (that is less than the first number of bits) may be used to encode the magnitude of change. The operations include sending the second set of bits and an indicator. The indicator indicates that the magnitude of change is encoded into the second number of bits.

The described features, functions, and advantages may be achieved independently in various embodiments or may be combined in yet other embodiments further details of which can be seen with reference to the following description and drawings.

DETAILED DESCRIPTION

The present disclosure describes systems and methods of adaptive encoding/decoding of data in order to reduce a number of bits to be used for transmission and/or storage of the data. For example, a sensor may measure (sample) a particular parameter (e.g., temperature or pressure) at a particular sampling rate, and measured values (e.g., analog value, such as voltages) may be encoded (e.g., digitized) into a set of bits. In the present disclosure, a reference value (e.g., a value used as a reference for compression of data) may be encoded into a "full" number of bits and stored (and optionally transmitted). As an illustrative, non-limiting example, the reference value may be encoded into 12 bits (e.g., the "full" number of bits). In other examples, the "full" number of bits may be more than 12 bits or fewer than 12 bits. Rather than encoding each subsequent measured value into the "full" number of bits, a measured value (at the "full" number of bits) of a subsequent data sample is compared to the reference value in order to determine a magnitude of change (a "delta") between the measured value and the reference value. The magnitude of change is encoded into a number of bits that is less than the "full" number of bits.

This process of encoding the magnitude of change into a reduced number of bits may be repeated for a particular number (N) of values that follow the reference value. Each of the N values is compared to the reference value to determine the magnitude of change between a particular measured value and the reference value. Comparing a measured value (at the "full" number of bits) to the reference value rather than comparing "delta" values may reduce drift due to errors in each "delta" value. After N values, a next measured value (N+1) is encoded as a "new" reference value (as a reference for compression of subsequent data).

To illustrate, when the reference value has 12 bits, the magnitude of change between a measured value and the reference value may be encoded into a reduced number of bits. As an example, a "default" reduced number of bits may be 8 bits. In other examples, the "default" reduced number of bits may be more than 8 bits or fewer than 8 bits. A particular number of bits may be selected as the "default" reduced number of bits such that most expected values can be encoded, using the encoding scheme, within the "default" number of bits. In some cases, the magnitude of change between the measured value and the reference value may be encoded as an 8-bit binary value (the "default" reduced number of bits). In other cases, the magnitude of change may be outside of a range of "delta" values that can be encoded into 8 bits. While the change may be encoded into a different reduced number of bits (e.g., 9, 10 or 11 bits), a detector/decoder may be "expecting" 8 bits (based on an encoding/decoding protocol). In the present disclosure, a particular indicator (or "codeword") that is encoded into the "default"

number of bits (e.g., 8 bits) may be pre-assigned to a particular "non-default" reduced number of bits (e.g., 9, 10, or 11 bits). The particular indicator provides a signal to the detector/decoder that a particular "delta" that follows the indicator is encoded into the "non-default" reduced number of bits. The "non-default" reduced number of bits may be decoded in order to identify the particular "delta" that follows the indicator. The examples provided herein describe different "non-default" reduced numbers of bits that are greater than the "default" reduced number of bits (e.g., 9, 10 or 11 bits compared to the "default" reduced number of 8 bits). In alternative embodiments (e.g., in cases of relatively "small" changes that can be encoded into fewer than the "default" reduced number of bits), the "default" reduced number of bits may be further reduced (e.g., to 7 bits or to 6 bits, etc.).

In an illustrative, non-limiting example of an encoding scheme, a difference between a measured temperature value and a reference temperature value may be reduced to a particular 8-bit binary value that corresponds to a temperature change in a range of −127 degrees to +128 degrees. When the temperature change between the measured value and the reference value is within this range (i.e., not greater than +128 and not less than −127), the temperature change may be encoded as an 8-bit binary value (the "default" reduced number of bits). In other cases, the temperature change may be outside of this range (i.e., greater than +128 or less than −127), and the change cannot be stored as an 8-bit binary value. While the change may be encoded into a different reduced number of bits (e.g., 9, 10 or 11 bits), a detector/decoder may be expecting an 8-bit binary value using this encoding scheme. In the present disclosure, an indicator (or "codeword") may be sent prior to sending the data in the different reduced number of bits to provide a signal to the decoder that a different binary value (e.g., a 9 bit delta value, a 10 bit delta value, or an 11 bit delta value) follows the indicator.

To illustrate, using the encoded scheme above, a comparator may be used to provide 8-bit binary values less than an absolute value of 127 to an encoder. In this example, the comparator does not provide the values −128, −127, and 127, allowing these values to be used as codewords. To illustrate, in "2's complement," the value −128 may be represented by the 8-bit binary value 10000000, the value −127 may be represented by the 8-bit binary value 10000001, and the value 127 may be represented by the 8-bit binary value 01111111. In this example, one codeword (e.g., 10000000) may be reserved for use as a first indicator of a first "non-default" reduced number of bits (e.g., 9 bits), another codeword (e.g., 10000001) may be reserved for use as a second indicator of a second "non-default" reduced number of bits (e.g., 10 bits), and another codeword (e.g., 01111111) may be reserved for use as a third indicator of a third "non-default" reduced number of bits (e.g., 11 bits). Thus, data that is stored/transmitted may be reduced in cases where the delta values fall within a "default" range, while the codewords may allow values outside of this range to be stored/transmitted when appropriate.

Figure 1:
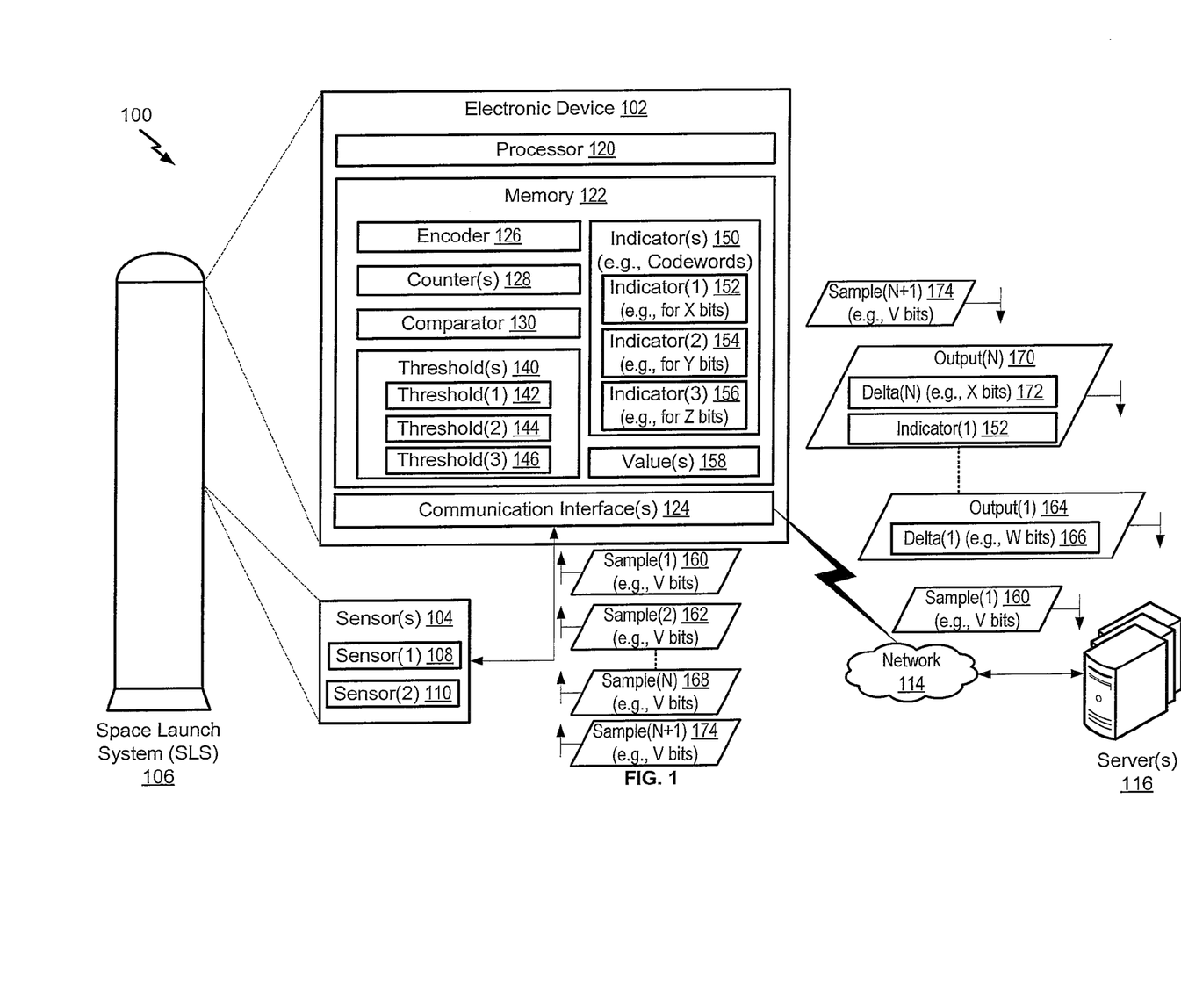
FIG. 1 is a block diagram of a particular embodiment of an adaptive data encoding system.

Referring to FIG. 1, a particular embodiment of an adaptive encoding system is illustrated and generally designated 100. FIG. 1 illustrates that a value (e.g., an analog value, such as a voltage) received from a sensor may be encoded (e.g., digitized) into a particular number of bits in order to reduce an amount of data that is stored, transmitted, or both. In FIG. 1, a reference value (corresponding to a particular data sample) may be encoded into a first number of bits (a "full" number of bits, such as 12 bits) and sent to memory and/or transmitted. Subsequent measured values (e.g., N values) may be compared to the reference value in order to determine a magnitude of change (a "delta"). The magnitude of change may be encoded into a reduced number of bits. In cases where the magnitude of change is outside of a range of values that may be encoded into a "default" reduced number of bits (e.g., 8 bits), an indicator (also referred to herein as a "codeword") may be used to signal a detector/decoder that the magnitude of change is encoded into a "non-default" reduced number of bits (e.g., 9, 10, or 11 bits).

In the embodiment illustrated in FIG. 1, an electronic device 102 is configured to receive data from one or more sensors 104 of a space launch system 106. In other cases, the sensor(s) 104 may be associated with another system (e.g., a refinery, a manufacturing facility, an aircraft, or a satellite, among other alternatives). In the example of FIG. 1, the one or more sensors 104 include a first sensor 108 (e.g., a temperature sensor) and a second sensor 110 (e.g., a pressure sensor). In other cases, the electronic device 102 may be configured to receive data from more than two sensors, fewer than two sensors, different sensors, or different types of sensors. In the example of FIG. 1, the electronic device 102 is configured to communicate via a network 114 (or multiple networks) to a server 116 (or multiple servers). For example, the server 116 may be a terrestrial system configured to communicate with the space launch system 106 (e.g., before, during, or after launch).

The electronic device 102 includes a processor 120, a memory 122, and a communication interface 124 (or multiple communication interfaces). In the example of FIG. 1, an encoder 126, a counter 128 (or multiple counters), a comparator 130, and one or more thresholds 140 are stored in the memory 122. FIG. 1 illustrates an example in which the threshold(s) 140 include a first threshold 142, a second threshold 144, and a third threshold 146. In alternative embodiments, an alternative number of threshold(s) may be stored in the memory 122. Further, FIG. 1 illustrates that one or more indicators 150 (e.g., "codewords") are stored in the memory 150. In the example of FIG. 1, the indicator(s) 150 include a first indicator 152, a second indicator 154, and a third indicator 156. In alternative embodiments, an alternative number of indicator(s) 150 may be stored in the memory 122. Each of the indicator(s) 150 may be associated with a particular threshold. To illustrate, the first indicator 152 may be associated with the first threshold 142, the second indicator 154 may be associated with the second threshold 144, and the third indicator 156 may be associated with the third threshold 146.

The electronic device 102 is configured to receive or sample measured values from the sensor(s) 104 (e.g., via the communication interface 124) at a particular sampling rate. As an illustrative example, the electronic device 102 may receive or sample a value (e.g., a voltage measured by a thermocouple in the case of a temperature sensor) from the first sensor 108 and may receive or sample another value (e.g., a value corresponding to a pressure measurement) from the second sensor 110. The encoder 126 is configured to encode data into a set of bits (having a particular number of bits that may vary based on a sampling rate of the sensor). In some cases, the encoded value may be stored in the memory 122 of the electronic device 102 (e.g., onboard the space launch system 106). Alternatively or additionally, the encoded value may be sent to the server 116 (e.g., a ground-based server configured to communicate with the space launch system 106).

In the particular embodiment illustrated in FIG. 1, the encoder 126 is configured to determine, based on the counter 128, whether to encode the data as a reference value (e.g., using a "full" number of bits). In the event that a measured value is not to be used as a reference value, a comparator 130 is configured to compare the measured value (e.g., a 12 bit value) to a reference value 158 (e.g., a 12 bit value) that is stored in the memory 122. Based on a result of the comparison, the comparator 130 is configured to determine a magnitude (and direction) of change between the measured value and the reference value 158. The comparator 130 is further configured to determine whether the magnitude of change is to be encoded into a first number of bits (e.g., W bits in FIG. 1, representing a "default" reduced number of bits, such as 8 bits) or is to be encoded into a different reduced number of bits (e.g., X, Y, or Z bits in FIG. 1, such as 9, 10, or 11 bits). The encoder 126 is configured to encode the magnitude of change into the reduced number of bits (as a "delta") and to provide the reduced number of bits as an output.

When the magnitude of change is to be encoded into a number of bits other than the "default" number of bits (e.g., a "non-default" reduced number of bits), the comparator 130 is configured to determine a particular indicator ("codeword") to be used by the encoder 126 to provide a signal to a detector/decoder that the magnitude of change is not encoded into the "default" number of bits. In the particular embodiment illustrated in FIG. 1, when the comparator 130 determines that the magnitude of change satisfies the first threshold 142 (e.g., associated with X-bit values), the encoder 126 is configured to use the first indicator 152. To illustrate, the first indicator 152 may be used to identify that the magnitude of change corresponds to a 9-bit value (e.g., a change that cannot be represented, based on the encoding scheme, using 8 bits). When the comparator 130 determines that the magnitude of change satisfies the second threshold 142 (e.g., associated with Y-bit values), the encoder 126 is configured to use the second indicator 154. To illustrate, the second indicator 154 may be used to identify that the magnitude of change corresponds to a 10-bit value (e.g., a change that cannot be represented, based on the encoding scheme, using 8 bits or 9 bits). When the comparator 130 determines that the magnitude of change satisfies the third threshold 146 (e.g., associated with Z-bit values), the encoder 126 is configured to use the third indicator 156. To illustrate, the third indicator 156 may be used to identify that the magnitude of change corresponds to an 11-bit value (e.g., a change that cannot be represented, based on the encoding scheme, using 8 bits, 9 bits, or 10 bits).

In operation, a particular sensor (e.g., the first sensor 108) provides a first sample 160 (identified as "Sample(1)" in FIG. 1) to the electronic device 102. For example, the first sample 160 may be a first voltage corresponding to a first sampled temperature, a first sampled pressure pressure, or another sampled parameter. The first sample 160 may be digitized as a particular number of bits (e.g., V bits in FIG. 1, representing a "full" number of bits used for a reference value). In the example of FIG. 1, the encoder 126 determines, based on the counter 128, that the first sample 160 is to be encoded into V bits and sent to the memory 122 for storage as the reference value 158 for comparison to a particular number (N) of subsequent sampled value(s). For example, the counter 128 may be incremented following storage of the first sample 160 as the reference value 158 in order to determine when a "new" reference value is to be encoded at the "full" number of bits. FIG. 1 further illustrates a particular embodiment in which the first sample 160 is transmitted to the server 116 (e.g., a ground-based server).

After providing the first sample 160, the first sensor 108 provides a second sample 162 (identified as "Sample(2)" in FIG. 1) to the electronic device 102. Alternatively, sensor output is continuous, and the first sensor 108 samples and digitizes the second sample 162 at a second time. For example, the second sample 162 may be a second voltage corresponding to a second sampled temperature. The encoder 126 determines (based on the counter 128) that the second sample 162 is not to be stored as a reference value. Instead, the second sample 162 is to be compared to the reference value 158 stored in the memory 122 (e.g., the first sample 160) in order to determine a magnitude of change to be encoded into a particular reduced number of bits. For example, the counter 128 may be "reset" (e.g., to a value of zero or one) following the storage of the first sample 160 as the reference value 158, and N (e.g., 10, 20, 50, etc.) samples following the first sample 160 (including the second sample 162) may be encoded into a reduced number of bits.

In the particular embodiment illustrated in FIG. 1, the comparator 130 determines that a magnitude of change between the reference value 158 and the second sample 162 does not satisfy the first threshold 142 and is to be encoded into a "default" number of bits (e.g., W bits, such as 8 bits). In this case, the encoder 126 encodes the magnitude of change into the "default" number of bits and generates a first output 164 (identified as "Output(1)" in FIG. 1) that includes a first change 166 (identified as "Delta(1)" in FIG. 1). FIG. 1 further illustrates that the first output 164 may be transmitted to the server 116. Alternatively or additionally, the first output 164 may be sent to the memory 122 for storage.

As an illustrative, non-limiting example, the magnitude of change between the reference value 158 and the second sample 162 may correspond to a temperature change, and the "default" reduced number of bits (W bits) may be 8 bits. When 8 bits are used, 256 digital values may be represented (e.g., 0-255). In this example, a temperature range may be divided into sub-ranges, each associated with a different digital value. Since temperature may vary up or down, the 256 sub-ranges may be shifted to +128 sub-ranges and −127 sub-ranges so that a direction of the temperature change can be represented. For example, when each sub-range is associated with 1° C., 8 bits may be used to represent changes from −127° C. to +128° C. In this example, when the temperature change is outside of this range (e.g., is greater than +128 degrees or is less than −127 degrees), the change cannot be represented by 8 bits. While the change may be encoded into a different number of bits (e.g., 9, 10 or 11 bits), a detector/decoder may be expecting an 8-bit value. In this case, one of the indicator(s) 150 (or "codewords") may be sent prior to sending the data in the different number of bits to provide a signal to the decoder that a different binary value (e.g., a 9 bit delta value, a 10 bit delta value, or an 11 bit delta value) follows the indicator.

After providing the second sample 160, FIG. 1 illustrates that the first sensor 108 provides additional subsequent samples. For example, the first sensor 108 may provide a sample 168 (identified as "Sample(N)" in FIG. 1) to the electronic device 102. FIG. 1 further illustrates that one or more intervening samples may optionally be provided before the sample 168. For example, the sample 168 may be a voltage corresponding to a temperature that is sampled after the second sample 162 (and potentially after the one or more intervening samples). The encoder 126 determines (based on the counter 128) that the sample 168 is not to be stored as a reference value. Instead, the sample 168 is to be compared to the reference value 158 stored in the memory 122 (e.g., the first sample 160) in order to determine a magnitude of change that is to be encoded into a reduced number of bits. The comparator 130 compares the reference value 158 stored in the memory 122 (e.g., the first sample 160) to determine the magnitude of change between the reference value 158 and a value of the sample 168.

In the particular embodiment illustrated in FIG. 1, the comparator 130 determines that the magnitude of change between the first sample 160 and the sample 168 satisfies the first threshold 142. Thus, the magnitude of change cannot be represented using the "default" number of bits (e.g., W bits in the example of FIG. 1). Accordingly, the magnitude of change may be encoded into a second ("non-default") number of bits (e.g., X bits in the example of FIG. 1). Further, the comparator 130 identifies the first indicator 152 as an indicator to be provided by the encoder 126. The indicator 152 indicates that the sample 168 is encoded into the second number of bits. In this case, the encoder 126 encodes the magnitude of change into the second number of bits and generates an output 170 (identified as "Output(N)" in FIG. 1) that includes the first indicator 152 and a change 172 (identified as "Delta(N)" in FIG. 1). FIG. 1 further illustrates that the output 170 may be transmitted to the server 116. Alternatively or additionally, the output 170 may be sent to the memory 122 for storage.

To illustrate, in a particular encoding scheme, the comparator 130 may be used to provide 8-bit binary values representing changes (e.g., temperature changes) between −126 and +126 to the encoder 126. Thus, if the particular encoding scheme is such that each digital value corresponds to 1° C., the first range may represent temperature changes between −126° C. and +126° C., etc. In this example, the comparator 130 reserves the values −128, −127, and 127 for use as codewords. To illustrate, in "2's complement," the value −128 may be represented by the 8-bit binary value 10000000, the value −127 may be represented by the 8-bit binary value 10000001, and the value 127 may be represented by the 8-bit binary value 01111111. As an illustrative, non-limiting example, the first indicator 152 (e.g., 10000000) may be used to identify that a magnitude of change (e.g., a temperature change having an absolute value from 127 to 256) corresponds to a 9-bit value that cannot be represented, based on the encoding scheme, using 8 bits. The second indicator 154 (e.g., 10000001) may be used to identify that a magnitude of change (e.g., a temperature change having an absolute value from 256 to 512) corresponds to a 10-bit value that cannot be represented, based on the encoding scheme using 8 bits (or 9 bits). The third indicator 156 (e.g., 01111111) may be used to identify that a magnitude of change (e.g., a temperature change having an absolute value from 512 to 1024) corresponds to an 11-bit value that cannot be represented, based on the encoding scheme using 8 bits (or 9 bits or 10 bits).

FIG. 1 illustrates a particular example in which the comparator 130 determines that the magnitude of change between the first sample 160 and the sample 168 satisfies the first threshold 142. In other cases, the comparator 130 may determine that the magnitude of change satisfies the second threshold 144 and is to be encoded into a third ("non-default") number of bits (e.g., Y bits in the example of FIG. 1). In this case, the encoder 126 may encode the magnitude of change into the third number of bits, and the output 170 may include the second indicator 154 and the change 172. As another example, the comparator 130 may determine that the magnitude of change satisfies the third threshold 146 and is to be encoded into a fourth ("non-default") number of bits (e.g., Z bits in the example of FIG. 1). In this case, the encoder 126 may encode the magnitude of change into the fourth number of bits, and the output 170 may include the third indicator 156 and the change 172.

FIG. 1 further illustrates that the first sensor 108 provides another sample 174 (identified as "Sample(N+1)" in FIG. 1) to the electronic device 102. For example, the sample 174 may be a voltage corresponding to a next temperature that is sampled after the sample 168. The encoder 126 determines, based on the counter 128, that the sample 174 is to be used as a "new" reference value for comparison to subsequent sampled values (not shown in FIG. 1). Accordingly, the sample 174 may be encoded into V bits (e.g., 12 bits) and stored in the memory 122. FIG. 1 further illustrates a particular embodiment in which the sample 174 is transmitted to the server 116 (e.g., a ground-based server).

Thus, FIG. 1 illustrates that an amount of data that is stored/transmitted may be reduced by selectively encoding changes ("deltas") between a reference value and subsequent values into a reduced number of bits. Comparing a measured value (at the "full" number of bits) to the reference value rather than comparing consecutive "delta" values (having a reduced number of bits) may reduce drift resulting from an error that occurs in one "delta" value propagating until a reference value is sampled. Further, in cases where the "delta" value is outside of a range of values that may be encoded into a "default" number of reduced bits (e.g., 8 bits), an indicator (also referred to herein as a "codeword") may be used to signal a detector/decoder that the particular value is encoded into a "non-default" number of bits (e.g., 9, 10, or 11 bits).

Figure 2:
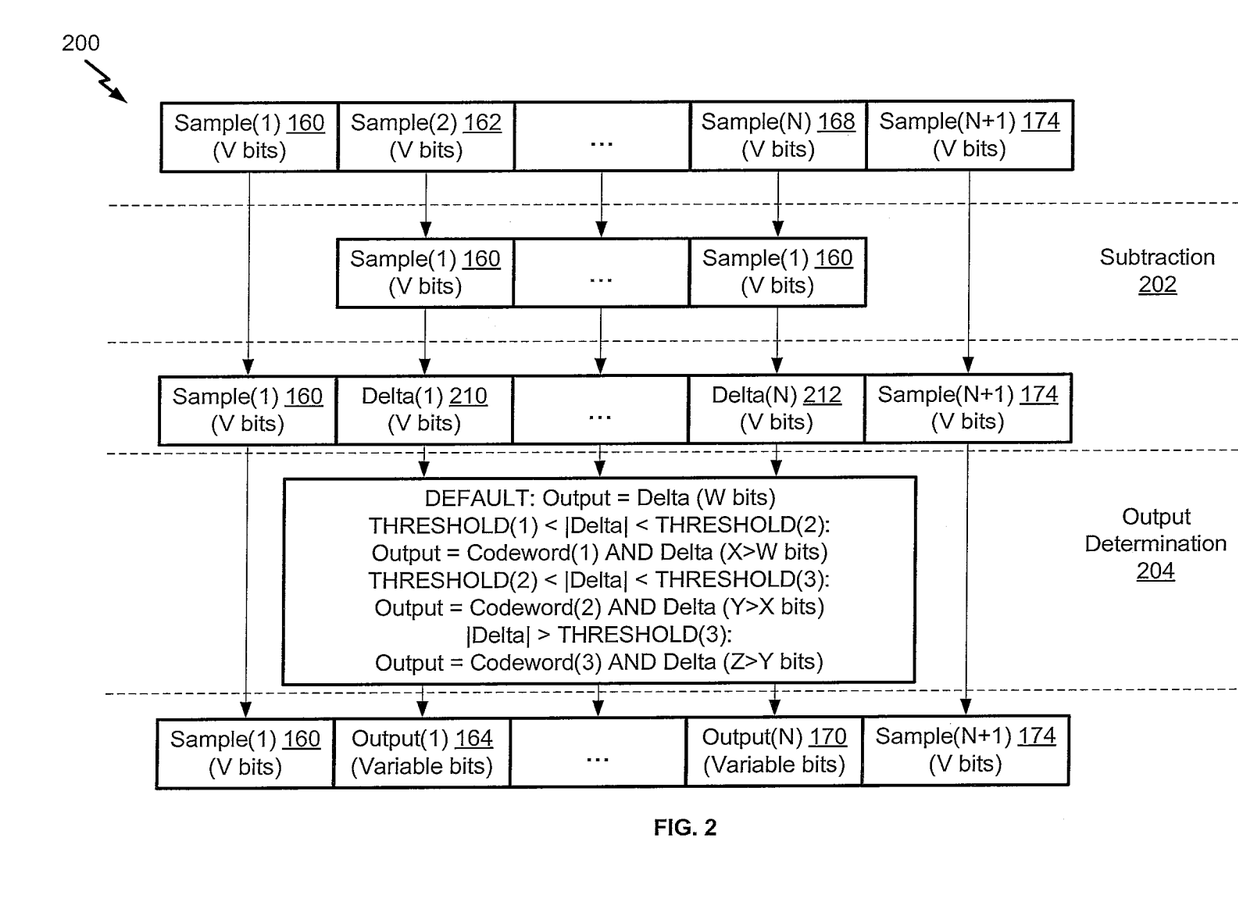
FIG. 2 is a diagram depicting a particular example of adaptively encoding data.

FIG. 2 is a diagram 200 depicting a particular example of adaptively encoding data. FIG. 2 illustrates that a reference value may be stored, and subsequent measured values may be compared to the reference value in order to determine a magnitude of change (a "delta") between the particular measured value and the reference value. The magnitude of change may be encoded into a number of bits that is less than a "full" number of bits. For example, the "full" number of bits may be 12 bits. In other examples, the "full" number of bits may be more than 12 bits or fewer than 12 bits. This process of encoding the magnitude of change into a reduced number of bits may be repeated for a particular number (N) of values that follow the reference value. Comparing a measured value (at the "full" number of bits) to the reference value rather than comparing "delta" values may reduce drift resulting from an error that occurs in one "delta" value propagating until a next reference value is sampled. FIG. 2 further illustrates that, in some cases, an indicator ("codeword") may be used to provide a signal to a detector/decoder that the magnitude of change is not encoded into a "default" reduced number of bits.

FIG. 2 illustrates that the first sample 160 may be encoded into a "full" number bits (to be used as a reference value). FIG. 2 further illustrates that, for subsequent samples, a subtraction operation 202 may be performed to determine a magnitude of change (a delta), and an output determination operation 204 may be performed to determine a reduced number of bits to be used for encoding the change. Optionally, an indicator to be provided in the event that the change is not encoded into a "default" reduced number of bits. The subtraction operation 202 and the output determination operation 204 may be performed for N samples. After N samples, a next sample (illustrated as "Sample(N+1)" in FIG. 2) may be provided at the full-bit rate (for storage as a "new" reference value).

As an example, the first sample 160 may be subtracted from the second sample 162 to determine a first change 210 (illustrated as "Delta(1)" in FIG. 2). FIG. 2 illustrates that the first change 210 may be compared to various thresholds in order to determine the first output 164. In the event that the first change 210 does not satisfy a threshold, the first change 210 may be encoded into a default reduced number of bits (e.g., 8 bits) and provided as the first output 164 (without an indicator). In the event that the first change 210 satisfies a first threshold but does not satisfy a second threshold, the first change 210 may be encoded into a first "non-default" reduced number of bits (e.g., 9 bits). In this case, the first output 164 may include a first codeword (an 8-bit value that is reserved for use as an indicator of 9-bit values). In the event that the first change 210 satisfies a second threshold but does not satisfy a third threshold, the first change 210 may be encoded into a second "non-default" reduced number of bits (e.g., 10 bits). In this case, the first output 164 may include a second codeword (an 8-bit value that is reserved for use as an indicator of 10-bit values). In the event that the first change 210 satisfies a third threshold, the first change 210 may be encoded into a third "non-default" reduced number of bits (e.g., 11 bits). In this case, the first output 164 may include a third codeword (an 8-bit value that is reserved for use as an indicator of 11-bit values). In alternative embodiments, more than three codewords or less than three codewords may be reserved for use as indicator(s) of a particular reduced number of bits that is different from the "default" reduced number of bits. As an example, when a "default" reduced number of bits is 7 bits, a fourth codeword may be reserved for use as an indicator of another "non-default" reduced number of bits (e.g., 8 bits in this example). As another example, when a "default" reduced number of bits is 10 bits (e.g., in the case of a high-frequency sensor, such as a pressure sensor), a single codeword may be reserved as an indicator of a single "non-default" reduced number of bits (e.g., 11 bits in this example).

As another example, the first sample 160 may be subtracted from the sample 168 (illustrated as "Sample(N)" in FIG. 2) to determine a change 212 (illustrated as "Delta(N)" in FIG. 2). FIG. 2 illustrates that the change 212 may be compared to various thresholds in order to determine the output 170. In the event that the change 212 does not satisfy the first threshold, the change 212 may be encoded into a default reduced number of bits (e.g., 8 bits) and provided as the output 170 (without an indicator). In the event that the change 212 satisfies the first threshold but does not satisfy the second threshold, the change 212 may be encoded into the first "non-default" reduced number of bits (e.g., 9 bits). In this case, the output 170 may include the first codeword (associated with 9-bit values). In the event that the change 212 satisfies the second threshold but does not satisfy the third threshold, the change 212 may be encoded into the second "non-default" reduced number of bits (e.g., 10 bits). In this case, the output 170 may include the second codeword (associated with 10-bit values). In the event that the change 212 satisfies the third threshold, the change 212 may be encoded into the third "non-default" reduced number of bits (e.g., 11 bits). In this case, the output 170 may include the third codeword (associated with 11-bit values).

Thus, FIG. 2 illustrates that data may be adaptively encoded into a reduced number of bits in order to reduce an amount of data that is stored/transmitted. Comparing a measured value to the reference value rather than comparing "delta" values may reduce drift due to errors in each "delta" value. Further, data that is stored/transmitted may be reduced in cases where the delta values fall within a "default" range, while codewords may allow values outside of this range to be stored/transmitted when appropriate.

Figure 3:
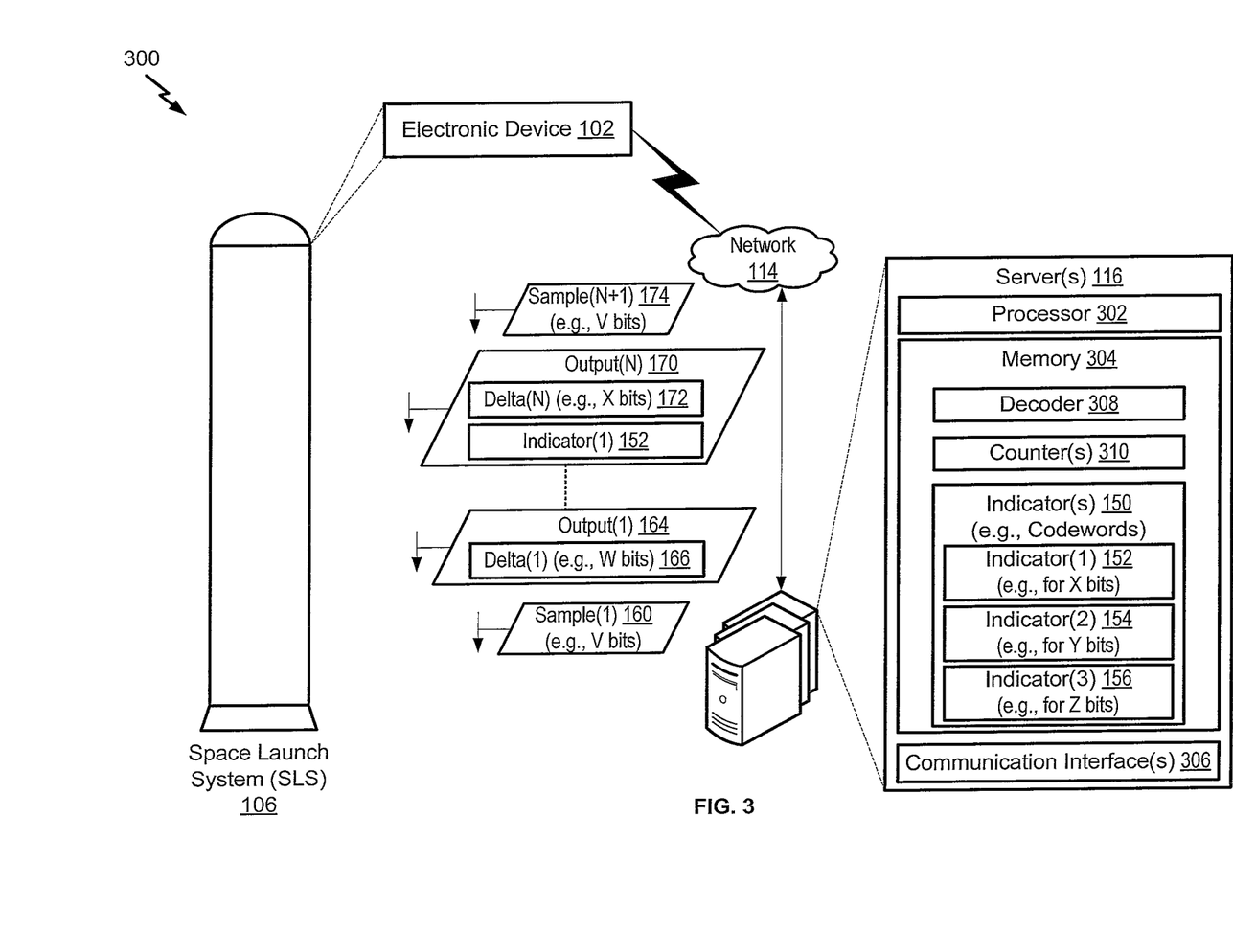
FIG. 3 is a block diagram of a particular embodiment of a system for decoding adaptively encoded data.

FIG. 3 is a block diagram 300 of a particular embodiment of a system for decoding adaptively encoded data. FIG. 3 illustrates that a detector/decoder may identify an indicator of an "unexpected" (or "non-default") reduced number of bits and determine the number of bits to be decoded based on the indicator.

In the embodiment illustrated in FIG. 3, the electronic device 102 is configured to receive data from one or more sensors of the space launch system 106. In the example of FIG. 3, the electronic device 102 is configured to communicate via the network 114 (or multiple networks) to the server 116 (or multiple servers). For example, the server 116 may be a terrestrial system configured to communicate with the space launch system 106 (e.g., before, during, or after launch). The server 116 includes a processor 302, a memory 304, and a communication interface 306 (or multiple communication interfaces). In the example of FIG. 3, a decoder 308, a counter 310 (or multiple counters), and the one or more indicators 150 are stored in the memory 304.

The server 116 may receive the first sample 160, and the decoder 308 may determine based on the counter 310 that the first sample 160 represents a "full" set of bits (e.g., V bits) to be decoded. The decoder 308 may decode the "full" set of bits to determine a value associated with the first sample 160. The server 116 may receive the first output 164, and the decoder 308 may determine based on the counter 310 that the first output 164 is not to be used as a reference value. When the decoder 308 determines that the first output 164 is not to be used as a reference value, the decoder 308 may determine whether the first output 164 is associated with one of the indicator(s) 150 stored in the memory 304. When the first output 164 is not associated with one of the indicator(s) 150, the decoder 308 may decode the first output 164 based on the "default" reduced number of bits to determine the change 166 (and optionally "re-create" the value based on the first sample 160 and the change 166).

The server 116 may receive the output 170. The output 170 includes a set of bits (e.g., the first indicator 152) having the "default" reduced number of bits. The decoder 308 may decode the set of bits and determine that the set of bits corresponds to the first indicator 152 (stored in the memory 304 of the server 116). The decoder 308 may determine (based on the first indicator 152) that a second number of bits (e.g., 9 bits, representing a "non-default" reduced number of bits) are to be decoded. The server 116 may receive the change 172 (e.g., a set of bits having a different number of bits than the "default" reduced number of bits). The decoder 308 may decode the set of bits (e.g., 9 bits in this example) to determine the magnitude of the change 172.

Thus, FIG. 3 illustrates that a detector/decoder may determine that a "non-default" reduced number of bits (e.g., 9, 10, or 11 bits) is to be decoded based on an indicator (encoded in the "default" reduced number of bits, such as 8 bits) that is assigned to a particular "non-default" reduced number of bits. After decoding the "default" reduced number of bits (e.g., the indicator encoded into 8 bits), the decoder may decode a next set of bits (e.g., 9 bits) to determine a magnitude of change between values.

Figure 4:
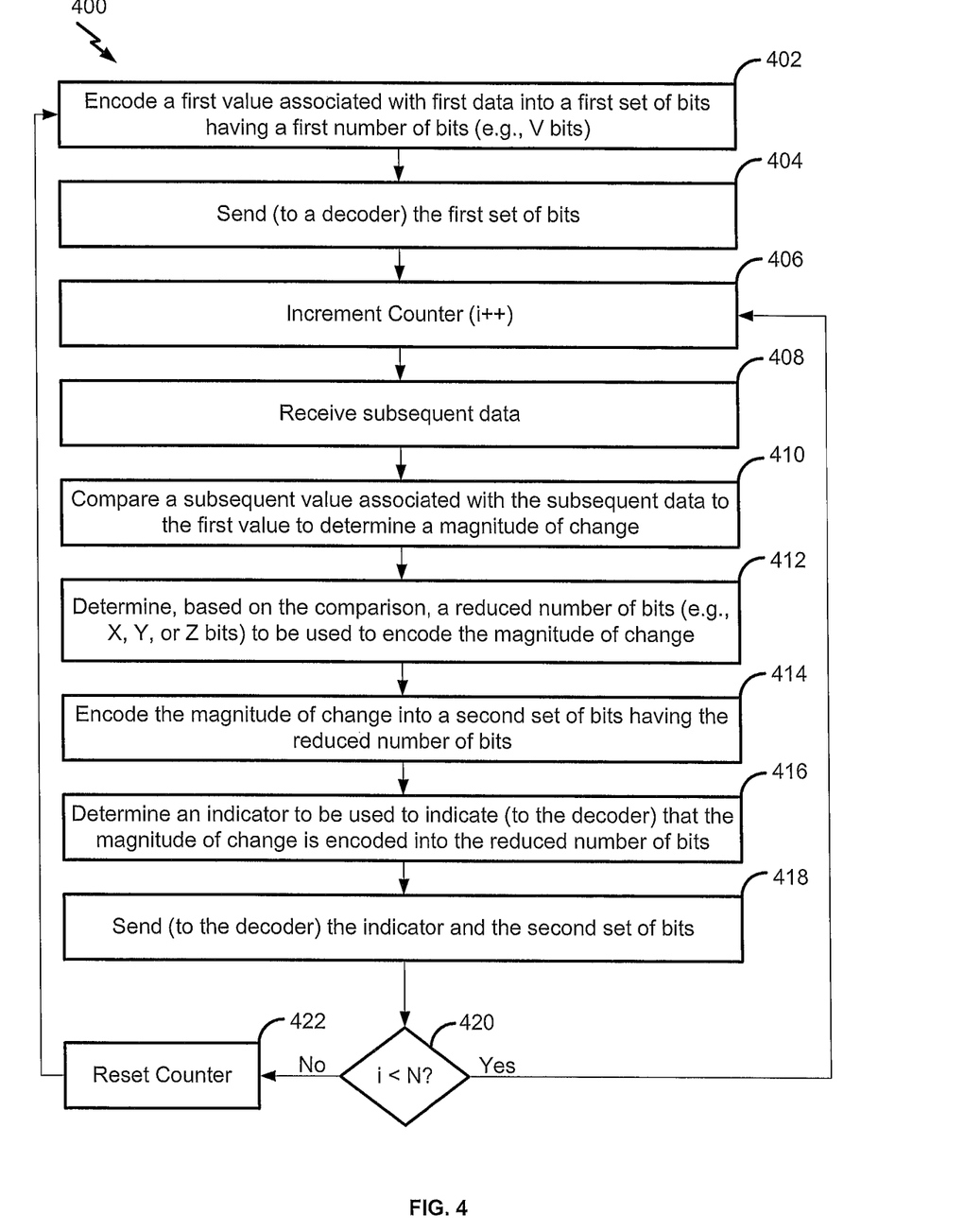
FIG. 4 is a flowchart depicting a particular embodiment of a method of adaptive encoding of data.

FIG. 4 is a flowchart depicting an exemplary embodiment of a method 400 of adaptively encoding data. In the particular embodiment illustrated in FIG. 4, a first value may be encoded into a first number of bits and may be sent to memory for storage as a reference value (and optionally to a decoder, such as a ground-based server). A second value may be encoded into a second number of bits that is different from the first number of bits. Based on a magnitude of change between the reference value (e.g., the first value) and the second value, an indicator (e.g., a "codeword") may be used to identify (to a detector/decoder) that the magnitude of change is encoded into a "non-default" reduced number of bits (e.g., the second number of bits). For example, a decoder may expect the second value to be encoded into a particular "default" reduced number of bits (e.g., 8 bits), and the indicator may provide a signal to the decoder that the second number of bits is a "non-default" reduced number of bits (e.g., 9, 10 or 11 bits).

The method 400 may include encoding a first value associated with first data (e.g., sensor data) into a first set of bits (having a first number of bits), at 402. For example, referring to FIG. 1, the encoder 126 may encode a first value associated with the first sample 160 into a first set of bits having a first number of bits (e.g., V bits) and store the first value as the reference value 158 in the memory 122. The method 400 may also include sending (to a decoder) the first set of bits, at 404. For example, referring to FIG. 1, the encoder 126 may send the first sample 160 to the server(s) 116 via the network 114.

In the particular embodiment illustrated in FIG. 4, the method 400 includes incrementing a counter, at 406. For example, referring to FIG. 1, the comparator 130 may increment the counter 128 stored in the memory 122 (e.g., after storing the reference value 158 in the memory 122). The method 400 includes receiving subsequent data, at 408. For example, referring to FIG. 1, the sample 168 may be received from the first sensor 108.

The method 400 includes comparing a subsequent value associated with the subsequent data to the first value to determine a magnitude of change (between the first value and the subsequent value), at 410. For example, referring to FIG. 1, the comparator 130 may compare the sample 168 to the reference value 158 (that is associated with the first sample 160 and that is stored in the memory 122) in order to determine the magnitude of change.

The method 400 includes determining, based on the comparison, a reduced number of bits to be used to encode the magnitude of change, at 412. For example, referring to FIG. 1, the comparator 130 may determine a "non-default" reduced number of bits (e.g., X bits) to be used to encode the magnitude of change. In other cases, the comparator 130 may determine that the magnitude of change corresponds to a value that can be represented, based on the encoding scheme, using a "default" reduced number of bits (e.g., W bits).

The method 400 includes encoding the magnitude of change (between the subsequent value and the first value) into a second set of bits having the reduced number of bits, at 414. For example, referring to FIG. 1, the encoder 126 may encode the magnitude of change into the second set of bits (e.g., X bits, such as 9 bits). In other cases, the encoder 126 may encode the magnitude of change into the "default" reduced number of bits (e.g., W bits).

In the particular embodiment illustrated in FIG. 4, the method 400 includes determining an indicator to be used to indicate (to the decoder) that the magnitude of change is encoded into the reduced number of bits, at 416. For example, referring to FIG. 1, the first indicator 152 may represent a "codeword" that is stored in the memory 122 to be used to indicate that the magnitude of change is encoded into a particular "non-default" reduced number of bits (e.g., X bits, such as 9 bits). In other cases, no indicator may be used in the event that the magnitude of change is encoded into the "default" reduced number of bits (e.g., W bits, such as 8 bits).

The method 400 may also include sending (to the decoder) the indicator if needed (e.g., for a "non-default" reduced number of bits) and the second set of bits, at 418. For example, referring to FIG. 1, the electronic device 102 (e.g., onboard the space launch system 106) may send the output 170 to the server 116. The output 170 includes the first indicator 152 and the change 172 (that is encoded into X bits).

In the particular embodiment illustrated in FIG. 4, the method 400 further includes determining whether the counter satisfies a threshold, at 420. The threshold may correspond to a number of sets of bits (having a reduced number of bits) that have been encoded and sent, or the threshold may correspond to a number of samples received after storing the reference value 158. For example, referring to FIG. 1, the comparator 130 may determine based on the counter 128 that the sample 174 represents a next value to be stored in the memory 122 as a "new" reference value for comparison to subsequent values.

In response to determining that the threshold has not been satisfied, the method 400 may return to 406, where the counter may be incremented. In response to determining that the threshold has been satisfied, the method 400 includes resetting the counter, at 422. For example, referring to FIG. 1, the counter 128 may be reset after the reference value 158 has been stored in the memory 122. After resetting the counter, the method 400 may return to 402, where another value (associated with subsequent data) may be encoded into another set of bits (having the first number of bits).

Figure 5:
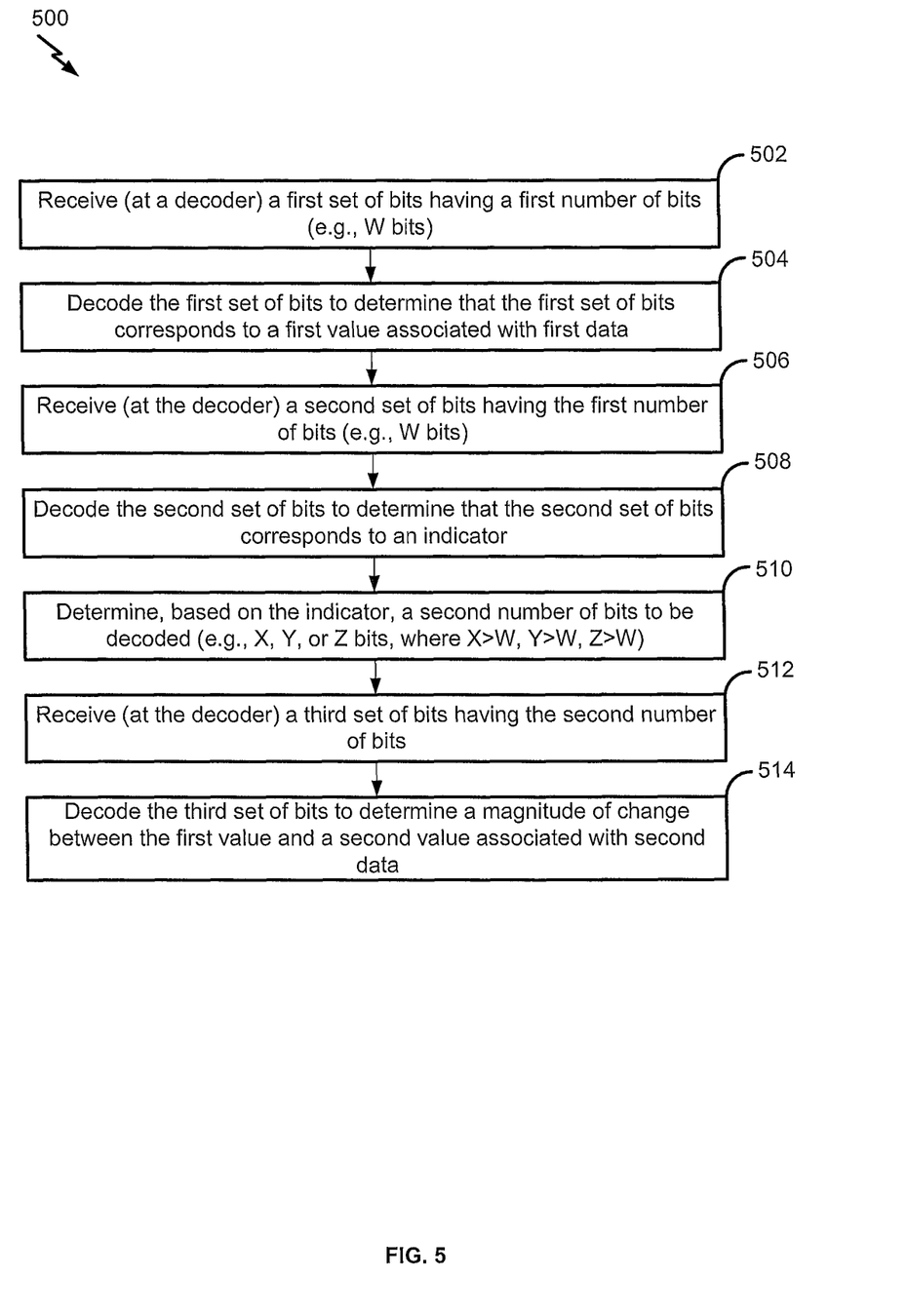
FIG. 5 is a flowchart depicting a particular embodiment of a method of decoding adaptively encoded data.

FIG. 5 is a flowchart depicting an exemplary embodiment of a method 500 of decoding adaptively encoded data. In the example of FIG. 5, a decoder may receive a first value that is encoded into a first number of bits (e.g., a "default" reduced number of bits, such as W bits), and the first value may be determined by decoding the first number of bits. FIG. 5 further illustrates that the decoder may receive an indicator (e.g., a codeword that is encoded into the "default" reduced number of bits) that provides a signal that a subsequent value is encoded into a "non-default" reduced number of bits (e.g., 9, 10 or 11 bits). The subsequent value may be determined by decoding the "non-default" reduced number of subsequent bits (e.g., 9, 10, or 11 bits following the indicator).

In the example of FIG. 5, the method 500 includes receiving (at a decoder) a first set of bits having a first number of bits, at 502. For example, referring to FIG. 3, the decoder 308 (at the server 116) may receive the first indicator 152 from the electronic device 102. The first indicator 152 may be encoded into a first number of bits (e.g., 8 bits, representing a "default" reduced number of bits to be decoded).

The method 500 also includes decoding the first set of bits to determine a first value (e.g., a value associated with first sensor data), at 504. For example, referring to FIG. 3, the decoder 308 may decode the output 164 (e.g., encoded into the "default" reduced number of bits, W bits) to determine the change 166.

The method 500 includes receiving (at the decoder) a second set of bits having the first number of bits, at 506. For example, referring to FIG. 3, the decoder 308 may receive the first indicator 152 (e.g., the first 8 bits of the output 170). The method 500 includes decoding the second set of bits and determining that the second set of bits corresponds to an indicator, at 508. For example, referring to FIG. 3, the decoder 308 may decode the first number of bits (e.g., the first 8 bits of the output 170, representing the "default" reduced number of bits to be decoded) and may identify the first indicator 152 based on information stored in the memory 304 of the server 116.

The method 500 includes determining, based on the indicator, a second number of bits to be decoded, at 510. The second number of bits is different from the first number of bits. For example, referring to FIG. 3, the decoder 308 may determine, based on the first indicator 152, that a particular "non-default" reduced number of bits are to be decoded (e.g., a next X, Y, or Z bits, such as 9, 10, or 11 bits).

The method 500 includes receiving (at the decoder) a third set of bits having the second number of bits, at 512. For example, referring to FIG. 3, the decoder 308 may receive the delta 172 (e.g., a next 9 bits of the output 170). The method 500 further includes decoding the third set of bits to determine a magnitude of change between the first value (the reference value) and a second value (e.g., associated with second sensor data), at 514. For example, referring to FIG. 3, the decoder 308 may decode the delta 172 to determine a magnitude of change from the first sample 160. In some embodiments, responsive to receiving the first indicator 152, the decoder 308 may continue to decode the particular "non-default" reduced number of bits until the decoder 308 receives a different indicator. To illustrate, a 9-bit value may be reserved as an indicator to provide a signal to the decoder 308 to return to decoding the "default" reduced number of bits (e.g., 8 bits). As another example, one or more 10-bit values may be reserved as indicator(s) to provide signal(s) to the decoder 308 to return to decoding the "default" reduced number of bits (e.g., 8 bits) or to decode a different "non-default" reduced number of bits (e.g., 9 bits). As a further example, one or more 11-bit values may be reserved as indicator(s) to provide signal (s) to the decoder 308 to return to decoding the "default" reduced number of bits (e.g., 8 bits) or to decode a different "non-default" reduced number of bits (e.g., 9 bits or 10 bits).

Figure 6:
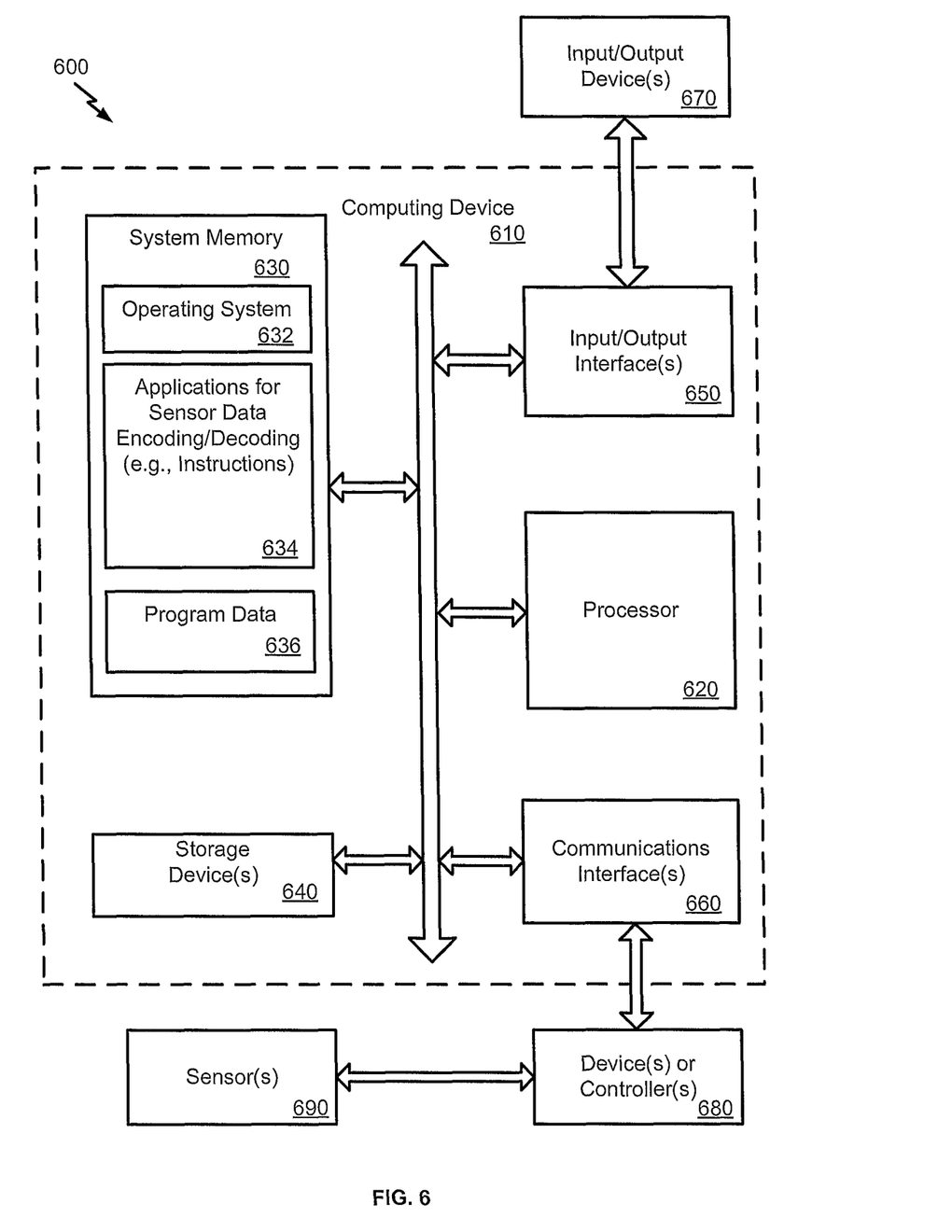
FIG. 6 is an illustration of a block diagram of a computing environment including a general purpose computing device configured to support embodiments of computer-implemented methods and computer-executable program instructions (or code) according to the present disclosure.

FIG. 6 is an illustration of a block diagram of a computing environment 600 including a general purpose computing device 610 configured to support embodiments of computer-implemented methods and computer-executable program instructions (or code) according to the present disclosure. For example, the computing device 610, or portions thereof, may execute instructions to adaptively encode/decode data in a particular number of bits. The computing device 610, or portions thereof, may further execute instructions according to any of the methods described herein.

The computing device 610 may include a processor 620. The processor 620 may communicate with the system memory 630, one or more storage devices 640, one or more input/output interfaces 650, one or more communications interfaces 660, or a combination thereof. The system memory 630 may include volatile memory devices (e.g., random access memory (RAM) devices), nonvolatile memory devices (e.g., read-only memory (ROM) devices, programmable read-only memory, and flash memory), or both. The system memory 630 may include an operating system 632, which may include a basic/input output system for booting the computing device 610 as well as a full operating system to enable the computing device 610 to interact with users, other programs, and other devices. The system memory 630 may include one or more applications 634 which may be executable by the processor 620. For example, the one or more applications 634 may include instructions executable by the processor 620 to adaptively encode/decode data in a particular number of bits. The system memory 630 may include program data 636 usable for controlling the adaptive encoding/decoding of data.

The processor 620 may also communicate with one or more storage devices 640. For example, the one or more storage devices 640 may include nonvolatile storage devices, such as magnetic disks, optical disks, or flash memory devices. The storage devices 640 may include both removable and non-removable memory devices. The storage devices 640 may be configured to store an operating system, images of operating systems, applications, and program data. In a particular embodiment, the memory 630, the storage devices 640, or both, include tangible computer-readable media.

The processor 620 may also communicate with one or more input/output interfaces 650 that enable the computing device 610 to communicate with one or more input/output devices 670 to facilitate user interaction. The input/output interfaces 650 may include serial interfaces (e.g., universal serial bus (USB) interfaces or Institute of Electrical and Electronics Engineers (IEEE) 1394 interfaces), parallel interfaces, display adapters, audio adapters, and other interfaces. The input/output devices 670 may include keyboards, pointing devices, displays, speakers, microphones, touch screens, and other devices. The processor 620 may detect interaction events based on user input received via the input/output interfaces 1150. Additionally, the processor 620 may send a display to a display device via the input/output interfaces 650.

The processor 620 may communicate with devices or controllers 680 via the one or more communications interfaces 660. The one or more communications interfaces 660 may include wired Ethernet interfaces, IEEE 802 wireless interfaces, other wireless communication interfaces, or other network interfaces. The devices or controllers 680 may include host computers, servers, workstations, and other computing devices. FIG. 6 further illustrates that the devices or controllers 680 may be communicatively coupled to one or more sensors 690 (e.g., temperature sensors, pressure sensors, etc.). For example, the one or more sensors 690 may correspond to the sensor(s) 104 of FIG. 1.

Embodiments described above are illustrative and do not limit the disclosure. It is to be understood that numerous modifications and variations are possible in accordance with the principles of the present disclosure.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A method of encoding data, the method comprising:
   determining, by a processor, a magnitude of change between a first value associated with first data and a second value associated with second data based on a comparison of the first value and the second value, wherein the first value is encoded into a first set of bits having a first number of bits;
   determining, by the processor, based on the comparison of the first value and the second value, a second number of bits to be used to encode the magnitude of change, wherein the second number of bits is less than the first number of bits;

encoding, by the processor, the magnitude of change into a second set of bits, the second set of bits having the second number of bits; and sending, by the processor, the second set of bits and a first indicator, the first indicator indicating that the magnitude of change is encoded into the second number of bits.

2. The method of claim 1, further comprising generating an output that includes the first indicator and the second set of bits, wherein the magnitude of change between the first value and the second value is encoded into the second set of bits.

3. The method of claim 1, further comprising:
receiving third data;
determining a magnitude of change between the first value and a third value associated with the third data based on a comparison of the first value and the third value;
determining, based on the comparison of the first value and the third value, a third number of bits to be used to encode the magnitude of change between the first value and the third value, wherein the third number of bits is less than the first number of bits;
encoding the magnitude of change between the first value and the third value into a third set of bits, the third set of bits having the third number of bits; and
sending the third set of bits and a second indicator, the second indicator indicating that the magnitude of change between the first value and the third value is encoded into the third number of bits.

4. The method of claim 3, wherein:
the first indicator is selected in response to determining that the magnitude of change between the first value and the second value satisfies a first threshold; and
the second indicator is selected in response to determining that the magnitude of change between the first value and the third value satisfies a second threshold.

5. The method of claim 1, further comprising:
receiving third data;
determining, based on a counter, that a third value associated with the third data is to be encoded into a third set of bits, the third set of bits having the first number of bits;
encoding the third value into the third set of bits; and
sending the third set of bits.

6. The method of claim 5, wherein the counter indicates a number of values that have been encoded into sets of bits having a reduced number of bits with respect to the first number of bits.

7. The method of claim 1, further comprising:
receiving third data;
determining, based on a counter that indicates a number of values that have been encoded into sets of bits having a reduced number of bits with respect to the first number of bits, that a magnitude of change between the first value and a third value associated with the third data is to be determined based on a comparison of the first value and the third value;
determining, based on the comparison of the first value and the third value, a particular number of bits to be used to encode the magnitude of change between the first value and the third value, wherein the particular number of bits is less than the first number of bits; and
encoding the magnitude of change into a third set of bits, the third set of bits having the particular number of bits.

8. The method of claim 7, wherein the particular number of bits is the second number of bits, the method further comprising sending the third set of bits and the first indicator.

9. The method of claim 7, wherein the particular number of bits is different from the second number of bits, the method further comprising sending the third set of bits without sending the first indicator.

10. The method of claim 7, wherein the particular number of bits is different from the second number of bits, the method further comprising sending the third set of bits and a second indicator, the second indicator indicating that the magnitude of change between the first value and the third value is encoded into the particular number of bits.

11. The method of claim 1, wherein the first data is received from a sensor of a space launch system, and wherein the second data is received from the sensor of the space launch system.

12. The method of claim 1, wherein:
the first set of bits is sent to a memory, to a remote device, or a combination thereof; and
the second set of bits and the first indicator is sent to the memory, to the remote device, or a combination thereof.

13. A method of decoding data, the method comprising:
receiving, by a processor, a first set of bits having a first number of bits;
decoding, by the processor, the first set of bits;
determining, by the processor, that the first set of bits corresponds to a first indicator, wherein the first indicator indicates that a second number of bits are to be decoded, and wherein the second number of bits is different from the first number of bits;
receiving, by the processor, a second set of bits having the second number of bits; and
decoding, by the processor, the second set of bits to determine a magnitude of change between a first value associated with first data and a second value associated with second data.

14. The method of claim 13, further comprising:
receiving a third set of bits having the first number of bits;
decoding the third set of bits;
determining that the third set of bits corresponds to a second indicator, wherein the second indicator indicates a third number of bits to be decoded, and wherein the third number of bits is different from the first number of bits and is different from the second number of bits;
receiving a fourth set of bits having the third number of bits; and
decoding the fourth set of bits to determine a magnitude of change between the first value associated with first data and a third value associated with third data.

15. The method of claim 13, further comprising:
receiving a third set of bits having the first number of bits;
decoding the third set of bits; and
determining that the third set of bits corresponds to a third value associated with third data.

16. The method of claim 13, further comprising:
receiving a third set of bits having the second number of bits; and
decoding the third set of bits to determine a magnitude of change between the first value associated with first data and a third value associated with third data.

17. A system comprising:
a processor; and
a memory communicatively coupled to the processor, the memory storing instructions that are executable by the processor to perform operations comprising:
determining a magnitude of change between a first value associated with first data and a second value associated with second data based on a comparison of the first value and the second value, wherein the first value is encoded into a first set of bits having a first number of bits;

determining, based on the comparison of the first value and the second value, a second number of bits to be used to encode the magnitude of change, wherein the second number of bits is less than the first number of bits;

encoding the magnitude of change into a second set of bits, the second set of bits having the second number of bits; and sending the second set of bits and an indicator, the indicator indicating that the magnitude of change is encoded into the second number of bits.

18. The system of claim 17, wherein the operations further comprise generating an output that includes the indicator and the second set of bits, wherein the magnitude of change between the first value and the second value is encoded into the second set of bits.

19. The system of claim 17, wherein the first data and the second data are captured by a sensor of a space launch system.

20. The system of claim 19, wherein the operations further comprise sending the first set of bits, the indicator, and the second set of bits to a ground-based system via a wireless transmission.

* * * * *